United States Patent
Huang

(10) Patent No.: US 10,346,040 B2
(45) Date of Patent: Jul. 9, 2019

(54) DATA MERGING MANAGEMENT METHOD BASED ON DATA TYPE, MEMORY STORAGE DEVICE AND MEMORY CONTROL CIRCUIT UNIT

(71) Applicant: PHISON ELECTRONICS CORP., Miaoli (TW)

(72) Inventor: Jyun-Kai Huang, Taoyuan (TW)

(73) Assignee: PHISON ELECTRONICS CORP., Miaoli (TW)

( * ) Notice: Subject to any disclaimer, the term of this patent is extended or adjusted under 35 U.S.C. 154(b) by 0 days.

(21) Appl. No.: 15/158,600

(22) Filed: May 19, 2016

(65) Prior Publication Data
US 2017/0277436 A1 Sep. 28, 2017

(30) Foreign Application Priority Data

Mar. 22, 2016 (TW) .............................. 105108743 A

(51) Int. Cl.
*G06F 3/06* (2006.01)
*G11C 8/06* (2006.01)
*G11C 16/08* (2006.01)
*G11C 16/10* (2006.01)

(52) U.S. Cl.
CPC ............ *G06F 3/0605* (2013.01); *G06F 3/061* (2013.01); *G06F 3/064* (2013.01); *G06F 3/065* (2013.01); *G06F 3/0652* (2013.01); *G06F 3/0659* (2013.01); *G06F 3/0679* (2013.01); *G11C 8/06* (2013.01); *G11C 16/08* (2013.01); *G11C 16/10* (2013.01)

(58) Field of Classification Search
CPC ........ G06F 3/061; G06F 3/064; G06F 3/0652; G06F 3/0679; G11C 16/10
See application file for complete search history.

(56) References Cited

U.S. PATENT DOCUMENTS

| 2012/0144095 | A1* | 6/2012 | Han | G06F 12/0246 711/103 |
| 2015/0347025 | A1* | 12/2015 | Law | G06F 3/0611 711/103 |
| 2017/0123726 | A1* | 5/2017 | Sinclair | G06F 3/0659 |

FOREIGN PATENT DOCUMENTS

| TW | I423022 | 1/2014 |
| TW | I451247 | 9/2014 |

OTHER PUBLICATIONS

TN-2960: Garbage Collection in SLC NAND Flash Memory, Micron Technology Inc., Oct. 2010 [retrieved from Internet Jul. 6, 2017][<URL:https://www.micron.com/resource-details/9a24abfb-4e32-46d5-b792-57040b57af85>].*
"Office Action of Taiwan Counterpart Application", date Mar. 29, 2017, p. 1-p. 6, in which the listed references ere cited.

* cited by examiner

*Primary Examiner* — David Yi
*Assistant Examiner* — Nicholas A. Paperno
(74) *Attorney, Agent, or Firm* — JCIPRNET

(57) ABSTRACT

A memory management method is provided according to an exemplary embodiment. The method includes: receiving first data; performing a first programming process and a data merging process; and stopping the data merging process before the total number of first-type physical unit reaches a second threshold value if the first data is first-type data. Accordingly, an influence caused by the data merging process on the writing speed for specific type of data may be reduced.

24 Claims, 8 Drawing Sheets

DATA MERGING MANAGEMENT METHOD BASED ON DATA TYPE, MEMORY STORAGE DEVICE AND MEMORY CONTROL CIRCUIT UNIT

CROSS-REFERENCE TO RELATED APPLICATION

This application claims the priority benefit of Taiwan application serial no. 105108743, filed on Mar. 22, 2016. The entirety of the above-mentioned patent application is hereby incorporated by reference herein and made a part of this specification.

BACKGROUND

Technical Field

The disclosure relates to a memory management technique, and more particularly, to a memory management method, a memory storage device and a memory control circuit unit.

Description of Related Art

The markets of digital cameras, cellular phones, and MP3 players have expanded rapidly in recent years, resulting in escalated demand for storage media by consumers. The characteristics of data non-volatility, low power consumption, and compact size make a rewritable non-volatile memory module (e.g., a flash memory) ideal to be built in the portable multi-media devices as cited above.

In general, testers may perform performance testing programs on memory devices in order to evaluate performance of the memory devices. In some of the performance testing programs, sequential data and non-sequential data are alternately written into the memory device, so as to test an execution performance of the memory device for a sequential write operation and a random write operation. However, in certain cases, if excessive number of spare physical blocks is used by the random write operation, a data merging process (e.g., a garbage collection process) may be triggered in the subsequent process for testing the sequential write operation, and thereby reducing a writing speed of the sequential write operation.

Nothing herein should be construed as an admission of knowledge in the prior art of any portion of the present disclosure. Furthermore, citation or identification of any document in this application is not an admission that such document is available as prior art to the present disclosure, or that any reference forms a part of the common general knowledge in the art.

SUMMARY

The disclosure is directed to a memory management method, a memory storage device and a memory control circuit unit, which are capable of reducing an influence caused by a data merging process on a writing speed of specific type of data.

An exemplary embodiment of the disclosure provides a memory management method for a rewritable non-volatile memory module having a plurality of physical units. The memory management method includes: receiving first data and performing a first programming process; programming at least one part of the first data into a first physical unit of the physical units in the first programming process; determining whether a total number of a first-type physical unit among the physical units is no larger than a first threshold value, wherein each physical unit belonging to the first-type physical unit does not store valid data; performing a data merging process if the total number of the first-type physical unit is no larger than the first threshold value, such that the total number of the first-type physical unit is changed from a first number to a second number, wherein the second number is greater than the first number; determining whether the first data is first-type data or second-type data, wherein the first-type data belongs to a plurality of consecutively numbered logical units and the second-type data does not belong to the consecutively numbered logical units; stopping the data merging process before the second number reaches a second threshold value if the first data is the first-type data, wherein the second threshold value is greater than the first threshold value; and stopping the data merging process after the second number reaches the second threshold value if the first data is the second-type data.

Another exemplary embodiment of the disclosure provides a memory storage device, which includes a connection interface unit, a rewritable non-volatile memory module and a memory control circuit unit. The connection interface unit is configured to couple to a host system. The rewritable non-volatile memory module includes a plurality of physical units. The memory control circuit unit is coupled to the connection interface unit and the rewritable non-volatile memory module. The memory control circuit unit is configured to receive first data and perform a first programming process. The memory control circuit unit is further configured to send a programming command sequence instructing for programming at least one part of the first data into a first physical unit of the physical units in the first programming process. The memory control circuit unit is further configured to determine whether a total number of a first-type physical unit among the physical units is no larger than a first threshold value, wherein each physical unit belonging to the first-type physical unit does not store valid data. The memory control circuit unit is further configured to perform a data merging process if the total number of the first-type physical unit is no larger than the first threshold value, such that the total number of the first-type physical unit is changed from a first number to a second number, wherein the second number is greater than the first number. The memory control circuit unit is further configured to determine whether the first data is first-type data or second-type data, wherein the first-type data belongs to a plurality of consecutively numbered logical units and the second-type data does not belong to the consecutively numbered logical units. The memory control circuit unit is further configured to stop the data merging process before the second number reaches a second threshold value if the first data is the first-type data, wherein the second threshold value is greater than the first threshold value. The memory control circuit unit is further configured to stop the data merging process after the second number reaches the second threshold value if the first data is the second-type data.

Another exemplary embodiment of the disclosure provides a memory control circuit unit, which is configured to control a rewritable non-volatile memory module having a plurality of physical units. The memory control circuit unit includes a host interface, a memory interface and a memory management circuit. The host interface is configured to couple to a host system. The memory interface is configured to couple to a rewritable non-volatile memory module. The memory management circuit is coupled to the host interface and the memory interface. The memory management circuit is configured to receive first data and perform a first programming process. The memory management circuit is further configured to send a programming command sequence instructing for programming at least one part of the first data into a first physical unit of the physical units in the first programming process. The memory management circuit is further configured to determine whether a total number of a first-type physical unit among the physical units is no larger than a first threshold value, wherein each physical unit belonging to the first-type physical unit does not store valid data. The memory management circuit is further configured to perform a data merging process if the total number of the first-type physical unit is no larger than the first threshold value, such that the total number of the first-type physical unit is changed from a first number to a second number, wherein the second number is greater than the first number. The memory management circuit is further configured to determine whether the first data is first-type data or second-type data, wherein the first-type data belongs to a plurality of consecutively numbered logical units and the second-type data does not belong to the consecutively numbered logical units. The memory management circuit is further configured to stop the data merging process before the second number reaches a second threshold value if the first data is the first-type data, wherein the second threshold value is greater than the first threshold value. The memory management circuit is further configured to stop the data merging process after the second number reaches the second threshold value if the first data is the second-type data.

Based on the above, during the operation of the memory storage device, one data merging process may be triggered with reduction of the first-type physical unit. After the data merging process is started, if it is determined that the data to be programmed is the first-type data belonging to a plurality of consecutively numbered logical units, the data merging process may be stopped before the total number of the first-type physical unit reaches one preset number, so as to reduce the influence caused by the data merging process on the writing speed of the first-type data.

To make the above features and advantages of the disclosure more comprehensible, several embodiments accompanied with drawings are described in detail as follows.

It should be understood, however, that this Summary may not contain all of the aspects and embodiments of the present disclosure, is not meant to be limiting or restrictive in any manner, and that the disclosure as disclosed herein is and will be understood by those of ordinary skill in the art to encompass obvious improvements and modifications thereto.

BRIEF DESCRIPTION OF THE DRAWINGS

The accompanying drawings are included to provide a further understanding of the disclosure, and are incorporated in and constitute a part of this specification. The drawings illustrate embodiments of the disclosure and, together with the description, serve to explain the principles of the disclosure.

DESCRIPTION OF THE EMBODIMENTS

Figure 1:
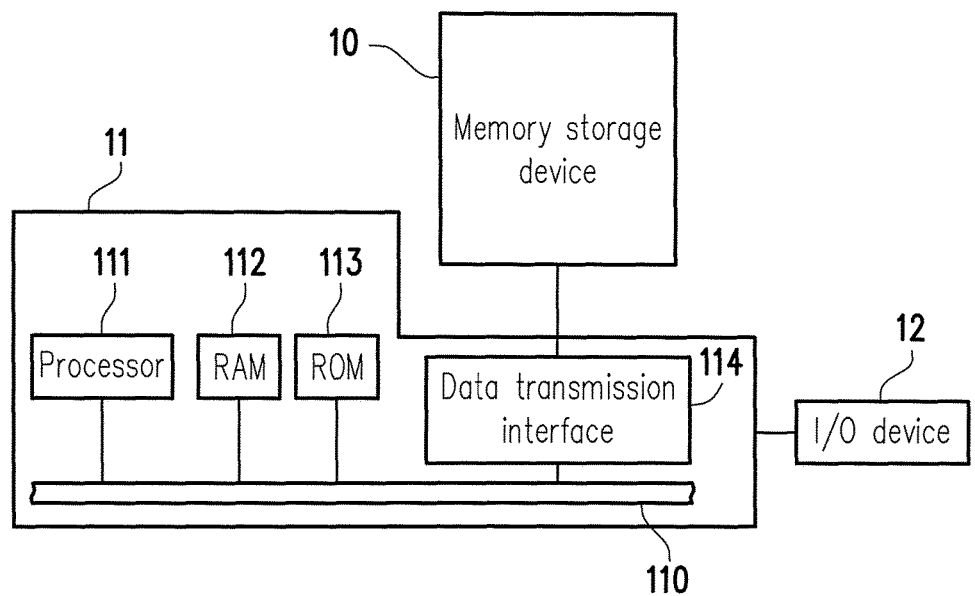
FIG. 1 is a schematic diagram illustrating a host system, a memory storage device and an I/O (input/output) device according to an exemplary embodiment of the disclosure.

Reference will now be made in detail to the present preferred embodiments of the disclosure, examples of which are illustrated in the accompanying drawings. Wherever possible, the same reference numbers are used in the drawings and the description to refer to the same or like parts.

Embodiments of the present disclosure may comprise any one or more of the novel features described herein, including in the Detailed Description, and/or shown in the drawings. As used herein, "at least one", "one or more", and "and/or" are open-ended expressions that are both conjunctive and disjunctive in operation. For example, each of the expressions "at least one of A, B and C", "at least one of A, B, or C", "one or more of A, B, and C", "one or more of A, B, or C" and "A, B, and/or C" means A alone, B alone, C alone, A and B together, A and C together, B and C together, or A, B and C together.

It is to be noted that the term "a" or "an" entity refers to one or more of that entity. As such, the terms "a" (or "an"), "one or more" and "at least one" can be used interchangeably herein.

Generally, the memory storage device (also known as a memory storage system) includes a rewritable non-volatile memory module and a controller (also known as a control circuit). The memory storage device is usually configured together with a host system so the host system may write data into the memory storage device or read data from the memory storage device.

Figure 2:
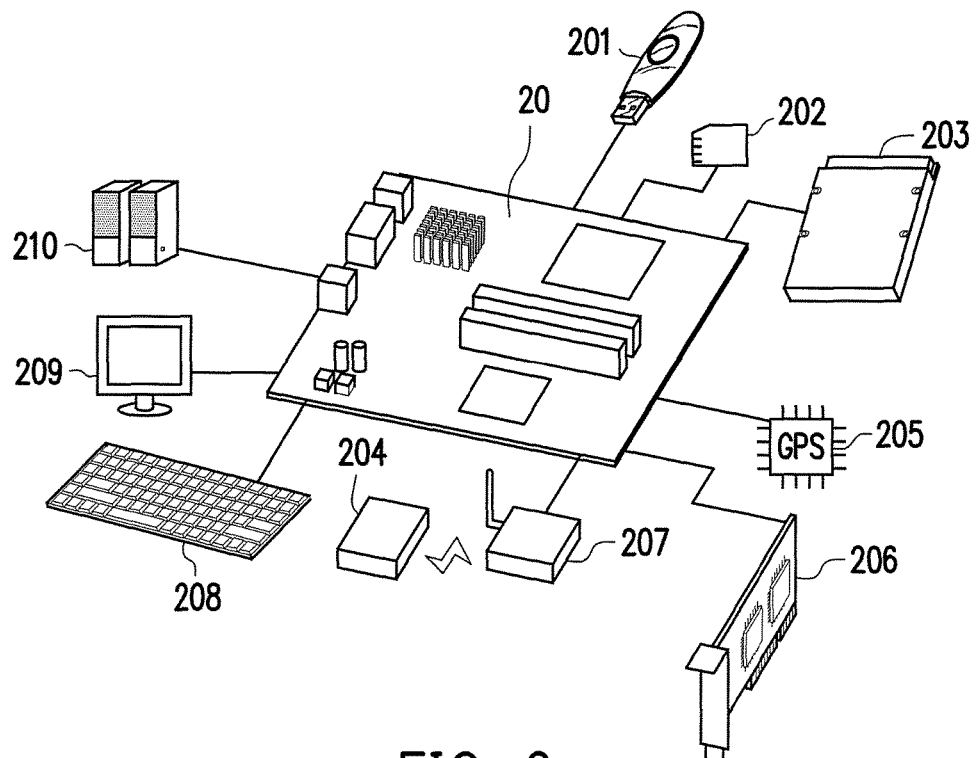
FIG. 2 is a schematic diagram illustrating a host system, a memory storage device and an I/O device according to another exemplary embodiment of the disclosure.

FIG. 1 is a schematic diagram illustrating a host system, a memory storage device and an I/O (input/output) device according to an exemplary embodiment of the disclosure. FIG. 2 is a schematic diagram illustrating a host system, a memory storage device and an I/O device according to another exemplary embodiment of the disclosure.

Referring to FIG. 1 and FIG. 2, a host system 11 generally includes a processor 111, a RAM (random access memory) 112, a ROM (read only memory) 113 and a data transmission interface 114. The processor 111, the RAM 112, the ROM 113 and the data transmission interface 114 are coupled to a system bus 110.

In the present exemplary embodiment, the host system 11 is coupled to a memory storage device 10 through the data transmission interface 114. For example, the host system 11 can store data into the memory storage device 10 or read data from the memory storage device 10 through the data transmission interface 114. Further, the host system 11 is coupled to an I/O device 12 through the system bus 110. For example, the host system 11 can transmit output signals to the I/O device 12 or receive input signals from I/O device 12 through the system bus 110.

In the present exemplary embodiment, the processor 111, the RAM 112, the ROM 113 and the data transmission interface 114 may be disposed on a main board 20 of the host system 11. The number of the data transmission interface 114 may be one or more. Through the data transmission interface 114, the main board 20 may be coupled to the memory storage device 10 in a wired manner or a wireless manner. The memory storage device 10 may be, for example, a flash drive 201, a memory card 202, a SSD (Solid State Drive) 203 or a wireless memory storage device 204. The wireless memory storage device 204 may be, for example, a memory storage device based on various wireless communication technologies, such as a NFC (Near Field Communication) memory storage device, a WiFi (Wireless Fidelity) memory storage device, a Bluetooth memory storage device, a BLE (Bluetooth low energy) memory storage device (e.g., iBeacon). Further, the main board 20 may also be coupled to various I/O devices including a GPS (Global Positioning System) module 205, a network interface card 206, a wireless transmission device 207, a keyboard 208, a monitor 209 and a speaker 210 through the system bus 110. For example, in an exemplary embodiment, the main board 20 may access the wireless memory storage device 204 through the wireless transmission device 207.

Figure 3:
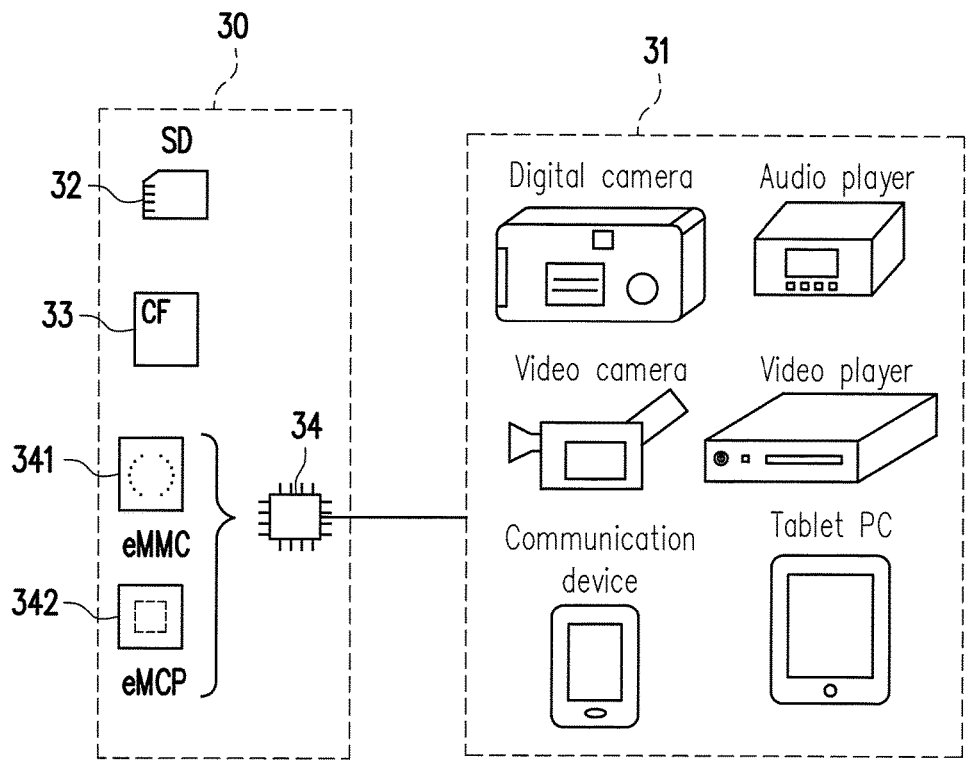
FIG. 3 is a schematic diagram illustrating a host system and a memory storage device according to another exemplary embodiment of the disclosure.

In an exemplary embodiment, the host system may be any system capable of substantially cooperating with the memory storage device for storing data. The host system is illustrated as a computer system in foregoing exemplary embodiment; nonetheless, FIG. 3 is a schematic diagram illustrating a host system and a memory storage device according to another exemplary embodiment of the disclosure. Referring to FIG. 3, in another exemplary embodiment, a host system 31 may also be a system, such as a digital camera, a video camera, a communication device, an audio player, a video player or a tablet computer, whereas a memory storage device 30 may be various non-volatile memory storage devices used by the host system 31, such as a SD (Secure Digital) card 32, a CF (Compact Flash) card 33 or an embedded storage device 34. The embedded storage device 34 includes various embedded storage devices capable of directly coupling a memory module onto a substrate of the host system, such as an eMMC (embedded MMC) 341 and/or an eMCP (embedded Multi Chip Package) storage device 342.

Figure 4:
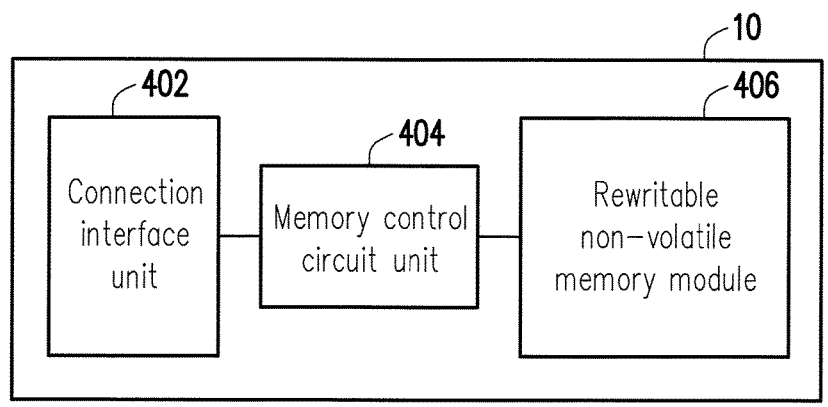
FIG. 4 is a schematic block diagram illustrating a memory storage device according to an exemplary embodiment of the disclosure.

FIG. 4 is a schematic block diagram illustrating a memory storage device according to an exemplary embodiment of the disclosure.

Referring to FIG. 4, the memory storage device 10 includes a connection interface unit 402, a memory control circuit unit 404 and a rewritable non-volatile memory module 406.

In the present exemplary embodiment, the connection interface unit 402 is compatible with a SATA (Serial Advanced Technology Attachment) standard. Nevertheless, it should be understood that the disclosure is not limited thereto. The connection interface unit 402 may also be compatible to a PATA (Parallel Advanced Technology Attachment) standard, an IEEE (Institute of Electrical and Electronic Engineers) 1394 standard, a PCI Express (Peripheral Component Interconnect Express) interface standard, a USB (Universal Serial Bus) standard, a SD interface standard, a UHS-I (Ultra High Speed-I) interface standard, a UHS-II (Ultra High Speed-II) interface standard, a MS (Memory Stick) interface standard, a Multi-Chip Package interface standard, a MMC (Multi Media Card) interface standard, an eMMC interface standard, a UFS (Universal Flash Storage) interface standard, an eMCP interface standard, a CF interface standard, an IDE (Integrated Device Electronics) interface standard or other suitable standards. The connection interface unit 402 and the memory control circuit unit 404 may be packaged into one chip, or the connection interface unit 402 is distributed outside of a chip containing the memory control circuit unit 404.

The memory control circuit unit 404 is configured to execute a plurality of logic gates or control commands which are implemented in a hardware form or in a firmware form and perform operations of writing, reading or erasing data in the rewritable non-volatile memory module 406 according to the commands of the host system 11.

The rewritable non-volatile memory module 406 is coupled to the memory control circuit unit 404 and configured to store data written from the host system 11. The rewritable non-volatile memory module 406 may be a SLC (Single Level Cell) NAND flash memory module (i.e., a flash memory module capable of storing one bit in one memory cell), a MLC (Multi Level Cell) NAND flash memory module (i.e., a flash memory module capable of storing two bits in one memory cell), a TLC (Triple Level Cell) NAND flash memory module (i.e., a flash memory module capable of storing three bits in one memory cell), other flash memory modules or any memory module having the same features.

In the rewritable non-volatile memory module 406, one or more bits are stored through changing a voltage (hereinafter, also known as a threshold voltage) of each of the memory cells. More specifically, in each of the memory cells, a charge trapping layer is provided between a control gate and a channel. Amount of electrons in the charge trapping layer may be changed by applying a write voltage to the control gate, and thereby changing the threshold voltage of the memory cell. This process of changing the threshold voltage is also known as "writing data into the memory cell" or "programming the memory cell". Each of the memory cells in the rewritable non-volatile memory module 406 has a plurality of storage states depended on changes in the threshold voltage. The memory cell belongs to which of the storage states may be determined by applying a read voltage, so as to obtain the one or more bits stored in the memory cell.

Figure 5:
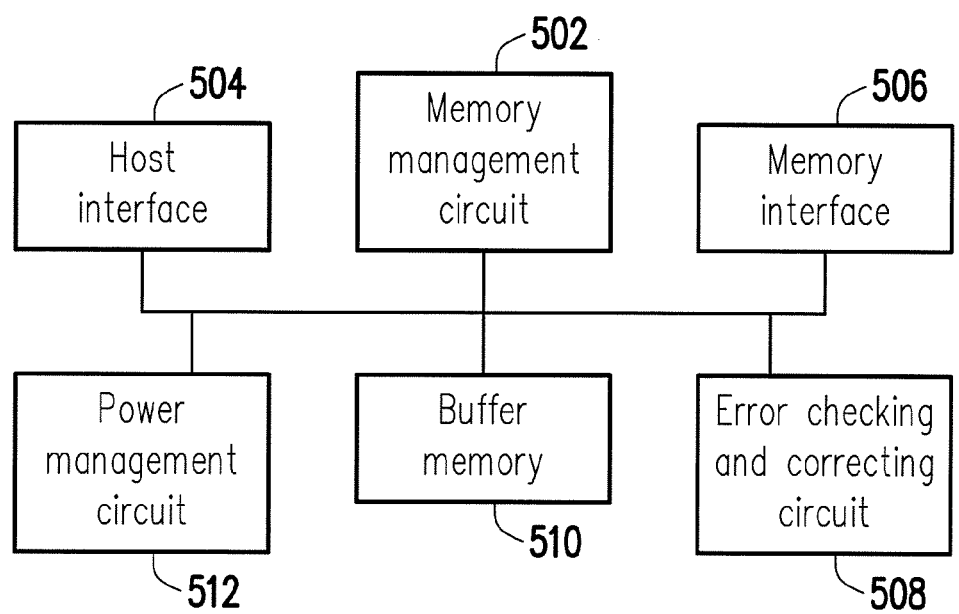
FIG. 5 is a schematic block diagram illustrating a memory control circuit unit according to an exemplary embodiment of the disclosure.

FIG. 5 is a schematic block diagram illustrating a memory control circuit unit according to an exemplary embodiment of the disclosure.

Referring to FIG. 5, the memory control circuit unit 404 includes a memory management circuit 502, a host interface 504 and a memory interface 506.

The memory management circuit 502 is configured to control overall operations of the memory control circuit unit 404. Specifically, the memory management circuit 502 has a plurality of control commands. During operation of the memory storage device 10, the control commands are executed to perform various operations such as writing, reading and erasing data. Hereinafter, operations of the memory management circuit 502 are described as equivalent to describe operations of the memory control circuit unit 404.

In the present exemplary embodiment, the control commands of the memory management circuit 502 are implemented in form of firmware. For instance, the memory management circuit 502 has a microprocessor unit (not illustrated) and a ROM (not illustrated), and the control commands are burned into the ROM. During operation of the memory storage device 10, the control commands are executed by the microprocessor to perform operations of writing, reading or erasing data.

In another exemplary embodiment, the control commands of the memory management circuit 502 may also be stored as program codes in a specific area (for example, the system area in a memory exclusively used for storing system data) of the rewritable non-volatile memory module 406. In addition, the memory management circuit 502 has a microprocessor unit (not illustrated), the read only memory (not illustrated) and a random access memory (not illustrated). More particularly, the ROM has a boot code, which is executed by the microprocessor unit to load the control commands stored in the rewritable non-volatile memory module 406 to the RAM of the memory management circuit 502 when the memory control circuit unit 404 is enabled. Then, the control commands are executed by the microprocessor unit to perform operations of writing, reading or erasing data.

Further, in another exemplary embodiment, the control commands of the memory management circuit 502 may also be implemented in a form of hardware. For example, the memory management circuit 502 includes a microprocessor, a memory cell management circuit, a memory writing circuit, a memory reading circuit, a memory erasing circuit and a data processing circuit. The memory cell management circuit, the memory writing circuit, the memory reading circuit, the memory erasing circuit and the data processing circuit are coupled to the microprocessor. The memory cell management circuit is configured to manage the memory cells of the rewritable non-volatile memory module 406 or the groups of the memory cells. The memory writing circuit is configured to issue a write command sequence (also known as a programming command sequence) for the rewritable non-volatile memory module 406 in order to write data into the rewritable non-volatile memory module 406. The memory reading circuit is configured to issue a read command sequence for the rewritable non-volatile memory module 406 in order to read data from the rewritable non-volatile memory module 406. The memory erasing circuit is configured to issue an erase command sequence for the rewritable non-volatile memory module 406 in order to erase data from the rewritable non-volatile memory module 406. The data processing circuit is configured to process the data to be written into the rewritable non-volatile memory module 406 and the data to be read from the rewritable non-volatile memory module 406. Each of the write command sequence, the read command sequence and the erase command sequence may include one or more program codes or command codes, respectively, and instruct the rewritable non-volatile memory module 406 to perform the corresponding operations, such as writing, reading and erasing of data. In an exemplary embodiment, the memory management circuit 502 may further issue command sequence of other types to the rewritable non-volatile memory module 406 for instructing to perform the corresponding operations.

The host interface 504 is coupled to the memory management circuit 502 and configured to receive and identify commands and data sent from the host system 11. In other words, the commands and data sent from the host system 11 are transmitted to the memory management circuit 502 through the host interface 504. In the present exemplary embodiment, the host interface 504 is compatible with the SATA standard. However, it should be understood that the disclosure is not limited thereto, and the host interface 504 may also be compatible with the PATA standard, the IEEE 1394 standard, the PCI Express standard, the USB standard, the SD standard, the UHS-I standard, the UHS-II standard, the MS standard, the MMC standard, the eMMC standard, the UFS standard, the CF standard, the IDE standard, or other suitable standards for data transmission.

The memory interface 506 is coupled to the memory management circuit 502 and configured to access the rewritable non-volatile memory module 406. That is, data to be written to the rewritable non-volatile memory module 406 is converted to a format acceptable to the rewritable non-volatile memory module 406 through the memory interface 506. Specifically, if the memory management circuit 502 intends to access the rewritable non-volatile memory module 406, the memory interface 506 sends corresponding command sequences. For example, the command sequences may include the write command sequence which instructs to write data, the read command sequence which instructs to read data, the erase command sequence which instructs to erase data, and other corresponding command sequences for instructing to perform various memory operations (e.g., changing read voltage levels, performing a garbage collection process and so on). These command sequences are generated by the memory management circuit 502 and transmitted to the rewritable non-volatile memory module 406 through the memory interface 506, for example. The command sequences may include one or more signals, or data stored in the bus. The signals or the data may include command codes and programming codes. For example, in a read command sequence, information such as identification codes and memory addresses are included.

In an exemplary embodiment, the memory control circuit unit 404 further includes an error checking and correcting circuit 508, a buffer memory 510 and a power management circuit 512.

The error checking and correcting circuit 508 is coupled to the memory management circuit 502 and configured to perform an error checking and correcting process to ensure a correctness of data. Specifically, when the memory management circuit 502 receives the write command from the host system 11, the error checking and correcting circuit 508 generates an ECC (error correcting code) and/or an EDC (error detecting code) for data corresponding to the write command, and the memory management circuit 502 writes data corresponding to the write command and the corresponding ECC and/or EDC into the rewritable non-volatile memory module 406. Later, when the memory management circuit 502 reads the data from the rewritable non-volatile memory module 406, the corresponding ECC and/or EDC are also read, and the error checking and correcting circuit 508 performs the error checking and correcting process for the read data based on the ECC and/or the EDC.

The buffer memory 510 is coupled to the memory management circuit 502 and configured to temporarily store data and commands from the host system 11 or data from the rewritable non-volatile memory module 406. The power management unit 512 is coupled to the memory management circuit 502 and configured to control a power of the memory storage device 10.

In the present exemplary embodiment, the memory cells of the rewritable non-volatile memory module 406 constitute a plurality of physical programming units, and the physical programming units constitute a plurality of physical erasing units. For example, the memory cells on the same word line constitute one or more physical programming units. If each of the memory cells can store more than two bits, the physical programming units on the same word line can be at least classified into a lower physical programming unit and an upper physical programming unit. For instance, a least significant bit (LSB) of one memory cell belongs to the lower physical programming unit, and a most significant bit (MSB) of one memory cell belongs to the upper physical programming unit. Generally, in the MLC NAND flash memory, a writing speed of the lower physical programming unit is higher than a writing speed of the upper physical programming unit, and/or a reliability of the lower physical programming unit is higher than a reliability of the upper physical programming unit.

In the present exemplary embodiment, the physical programming unit is a minimum unit for programming. That is, the physical programming unit is the minimum unit for writing data. For example, the physical programming unit is a physical page or a physical sector. When the physical programming unit is the physical page, the physical programming unit usually include a data bit area and a redundancy bit area. The data bit area includes multiple physical sectors configured to store user data, and the redundant bit area is configured to store system data (e.g., an error correcting code).

In the present exemplary embodiment, the data bit area contains 32 physical sectors, and a size of each physical sector is 512 bytes (B). However, in other exemplary embodiments, the data bit area may also include 8, 16 physical sectors or different number (more or less) of the physical sectors, and the size of each physical sector may also be greater or smaller. On the other hand, the physical erasing unit is the minimal unit for erasing. Namely, each physical erasing unit contains the least number of memory cells to be erased together. For instance, the physical erasing unit is a physical block.

Figure 6:
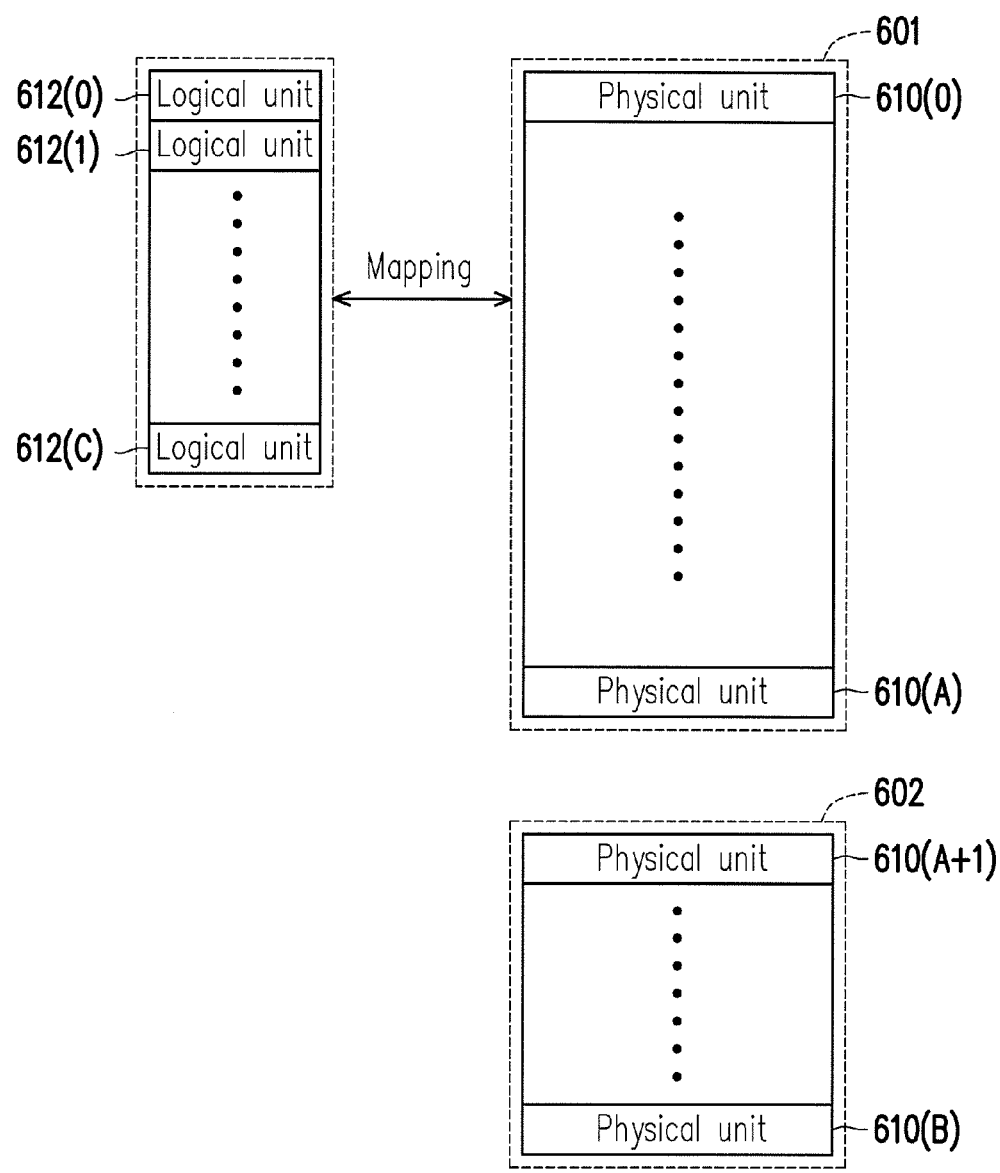
FIG. 6 is a schematic diagram illustrating management of a rewritable non-volatile memory module according to an exemplary embodiment of the disclosure.

FIG. 6 is a schematic diagram illustrating management of a rewritable non-volatile memory module according to an exemplary embodiment of the disclosure.

Referring to FIG. 6, the memory management circuit 502 logically groups the memory cells of the rewritable non-volatile memory module 406 into physical units 610(0) to 610(B). In the present exemplary embodiment, each of the physical units 610(0) to 610(B) refers to one physical erasing unit. However, in another exemplary, each of the physical units 610(0) to 610(B) may also contain a plurality of physical erasing units.

In the present exemplary embodiment, the memory management circuit 502 logically groups the physical units 610(0) to 610(B) into a storage area 601 and a spare area 602. The physical units 610(0) to 610(A) in the storage area 601 are stored with data, and the physical units 610(A+1) to 610(B) in the spare area 602 are not yet used for storing data. For example, each physical unit belonging to the storage area 601 may be stored with valid data and/or invalid data, and one physical unit belonging to the storage area 601 being erased is associated to the spare area 602. After one physical unit belonging to the storage area 601 is fully written, one specific physical unit is then selected from the spare area 602 and associated to the storage area 601 for storing other data.

In an exemplary embodiment, each physical unit belonging to the spare area 602 is also known as a spare physical unit, and each physical unit belonging to the storage area 601 is also known as a non-spare physical unit. In an exemplary embodiment, the spare physical unit is also known as a first-type physical unit, and the non-spare physical unit is also known as a second-type physical unit.

In the present exemplary embodiment, the memory management circuit 502 configures logical units 612(0) to 612(C) for mapping to at least one part of the physical units 610(0) to 610(A) in the storage area 601. In the present exemplary embodiment, the host system 11 accesses the data stored in the storage area 601 through a logical address (LA). Therefore, each of the logical units 612(0) to 612(C) refers to one logical address. However, in another exemplary embodiment, each of the logical units 612(0) to 612(C) may also be composed of a plurality of consecutive (e.g., consecutively numbered) logical addresses.

In the present exemplary embodiment, the memory management circuit 502 records a mapping relation (also known as a logical-physical mapping relation) between the logical units and the physical units into at least one logical-physical mapping table. When the host system 11 intends to read the data from the memory storage device 10 or write the data into the memory storage device 10, the memory management circuit 502 may access the data in the memory storage device 10 according to the logical-to-physical mapping table. In an exemplary embodiment, the logical-physical mapping table and specific management data (e.g., a management table recorded with management information of the memory storage device 10) are stored in other physical units not belonging to the storage area 601 and the spare area 602, so as to avoid being modified by the user.

In the present exemplary embodiment, the valid data is current data (or latest data) belonging to one specific logical unit, and the invalid data is not the current data belonging to any logical unit. For example, if the host system 11 stores new data into one specific logical unit to overwrite old data originally stored in that specific logical unit (i.e., update the data of specific logical unit), the new data in the storage area 601 is the current data belonging to that specific logical unit and marked as valid, whereas the old data being overwritten may still be stored in the storage area 601 but marked as invalid.

In the present exemplary embodiment, if data belonging to one specific logical unit is updated, a mapping relation between that specific logical unit and the physical unit stored with the old data belonging to that specific logical unit is removed, and a mapping relation between that specific logical unit and the physical unit stored with the current data (or the latest data) belonging to that specific logical unit is established. However, in another exemplary embodiment, if data belonging to one specific logical unit is updated, a mapping relation between that specific logical unit and the physical unit stored with the old data belonging to that specific logical unit may still be maintained.

When the memory storage device 10 leaves the factory, the total number of the physical units belonging to the spare area 602 (i.e., the first-type physical unit) is a preset number (e.g., 30). With the memory storage device 10 being used overtime, more physical units are selected from the spare area 602 and associated to the storage area 601 for storing data (e.g., the user data from the host system 11). Accordingly, the total number of the physical units belonging to the spare area 602 (e.g., the first-type physical unit) gradually decreases.

During operation of the memory storage device 10, the memory management circuit 502 continuously updates the total number of the physical units belonging to the spare area 602 (i.e., the first-type physical unit). The memory management circuit 502 determines whether the total number of the first-type physical unit is no larger than (e.g., less than or equal to) one threshold value (hereinafter, also known as a first threshold value). The first threshold value is, for example, a value being 2 or greater (e.g., 10), which is not particularly limited by the disclosure. If the total number of the first-type physical unit is no larger than the first threshold value, the memory management circuit 502 performs one data merging process. In an exemplary embodiment, the data merging process is also known as the garbage collection process.

In the data merging process, the memory management circuit 502 selects at least one physical unit from the storage area 601 and attempts to collectively copy (or move) valid data from the selected physical unit to another physical unit. The physical unit for storing the copied (or moved) valid data is selected from the spare area 602 and associated to the storage area 601. If the valid data stored in one specific physical unit is completely copied (or moved), that specific physical unit is then erased and associated to the spare area 602.

In an exemplary embodiment, the operation of re-associating one physical unit from the storage area 601 back to the spare area 602 is also known as releasing one spare physical unit. More spare physical units are released as an execution time of the data merging process increases. Accordingly, after the data merging process is started, the total number of the physical units belonging to the spare area 602 (i.e., the first-type physical unit) is gradually increased (e.g., changed from a first number to a second number). Herein, the second number is greater than the first number.

In the present exemplary embodiment, the memory management circuit 502 determines whether the total number of the first-type physical unit is greater than or equal to another threshold value (hereinafter, also known as a second threshold value). In the present exemplary embodiment, the second threshold value is greater than the first threshold value. For example, if the first threshold value is "2", the second threshold value may be "15" or any value greater than "2". If the total number of the first-type physical unit is greater than or equal to the second threshold value, the memory management circuit 502 stops the data merging process. In the present exemplary embodiment, stopping the data merging process refers to ending the executed data merging process. After one data merging process is stopped, the next data merging process may be performed if the total number of first-type physical unit is, once again, no larger than the first threshold value. However, in another exemplary embodiment, the second threshold value may also be equal to the first threshold value.

In the present exemplary embodiment, the total number of the physical units belonging to the spare area 602 (i.e., the first-type physical unit) is recorded in one management table. When one spare physical unit is released, the memory management circuit 502 adds "1" to the total number of the first-type physical unit recorded by the management table; when one spare physical unit from the spare area 602 is associated to the storage area 601 for storing data, the memory management circuit 502 subtracts "1" from the total number of the first-type physical unit recorded by the management table. During operation of the memory storage device 10, the memory management circuit 502 determines whether it is required to perform the next data merging process and/or stop the executing data merging process according to the total number of the first-type physical unit recorded by the management table.

In an exemplary embodiment, when intending to store data of specific type, the memory management circuit 502 may also directly stop the executing data merging process even if the total number of the first-type physical unit recorded by the management table does not reach the second threshold value yet. For example, in an exemplary embodiment, the data of specific type refers to the sequential data.

In an exemplary embodiment, the memory management circuit 502 receives data (hereinafter, also known as first data) from the host system 11 and accordingly performs a programming process (hereinafter, also known as a first programming process). In the first programming process, the memory management circuit 502 sends at least one programming command sequence to the rewritable non-volatile memory module 406 to instruct for programming at least one part of the first data into the rewritable non-volatile memory module 406.

In an exemplary embodiment, the memory management circuit 502 determines whether the first data is first-type data or second-type data. Herein, the first-type data refers to the sequential data, and the second-type data refers to the non-sequential data. For example, the first-type data belongs to a plurality of consecutive (or consecutively numbered) logical units, and the second-type data does not belong to the consecutive logical units. For example, if the first data is stored into a plurality of consecutively numbered logical units or a plurality of logical units within a specific logical address range, the first data is the first-type data; however, if the first data is stored into a plurality of non-consecutively numbered (i.e., discrete) logical units, the first data is the second-type data.

In an exemplary embodiment, if the first data is the first-type data, the first programming process may be regarded as the sequential write process; however, if the first data is the second-type data, the first programming process may be regarded as the random write process.

In an exemplary embodiment, if the first data is the first-type data (or if the first programming process is the sequential write process) and one data merging process is currently executing, the memory management circuit 502 may still directly stop the executing data merging process even if the total number of the first-type physical unit (i.e., aforesaid second number) recorded by the management table does not reach the second threshold value yet. Accordingly, the influence caused by the data merging process on the writing speed (or a writing bandwidth) for the sequential write process may be reduced. However, if the first data is the second-type data (or the first programming process is the random write process), the memory management circuit 502 stops the executing data merging process (only) when the total number of the first-type physical unit (i.e., aforesaid second number) recorded by the management table reaches the second threshold value.

Figure 7:
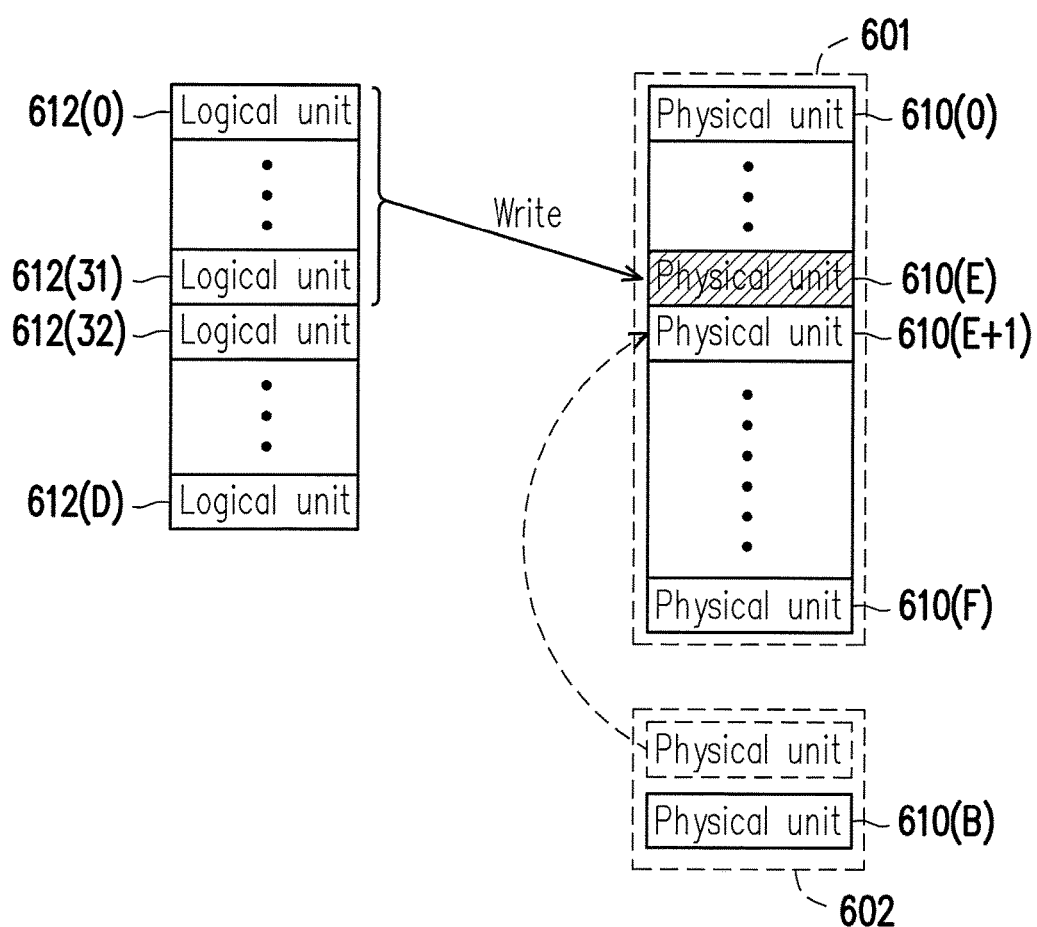
FIG. 7 is a schematic diagram of the programming process according to an exemplary embodiment of the disclosure.

FIG. 7 is a schematic diagram of the programming process according to an exemplary embodiment of the disclosure.

Referring to FIG. 7, the memory management circuit 502 receives data (i.e., the first data) belonging to the logical units 612(0) to 612(D) from the host system 11. Herein, the logical units 612(0) to 612(D) are consecutively numbered (or belong to the same logical address range), and thus the data belonging to the logical units 612(0) to 612(D) is the first-type data (i.e., the sequential data).

In an exemplary embodiment, if one logical unit refers to one logical address, the logical units 612(0) to 612(D) are composed of a plurality of consecutive logical addresses. Herein, any two consecutively numbered logical units have the consecutive logical addresses. In another exemplary embodiment, if one logical unit contains a plurality of consecutive logical addresses, it means that a starting logical address of the next logical unit follows an ending logical address of the previous logical unit for any two consecutively numbered logical units among the logical units 612(0) to 612(D). For example, the starting logical address of the logical unit 612(1) follows the ending logical address of the logical unit 612(0), the starting logical address of the logical unit 612(2) follows the ending logical address of the logical unit 612(1), and the rest may be deduced by analogy.

After the first data is received, the memory management circuit 502 performs the first programming process. In the first programming process, the memory management circuit 502 instructs to write the first data into at least one physical unit in the storage area 601. In the present exemplary embodiment, one physical unit may be used to store data belonging to 32 logical units, and thus the data belonging to the logical units 612(0) to 612(31) (i.e., at least one part of the first data) is first programmed into a physical unit 610(E) (hereinafter, also known a first physical unit). Meanwhile, the logical units 612(0) to 612(31) are mapped to the physical unit 610(E). Because the logical units 612(0) to 612(31) are consecutive (consecutively numbered), the data stored in the physical unit 610(E) is also the first-type data.

In an exemplary embodiment, the memory management circuit 502 determines whether the entire first data is the first-type data according to whether the data stored in the physical unit 610(E) is the first-type data and/or whether the data stored in the physical unit 610(E) belongs to the consecutive (or consecutively numbered) logical units. For example, the data stored in the physical unit 610(E) is the first-type data, and thus the memory management circuit 502 determines that the entire first data is the first-type data accordingly. In another exemplary embodiment, if the data stored in the physical unit 610(E) is the second-type data, the memory management circuit 502 determines that the entire first data is the second-type data. In an exemplary embodiment, the physical unit 610(E) further stores additional system data. The system data indicates whether the data stored in the physical unit 610(E) is the first-type data and/or the logical units (or the logical addresses) occupied by the data stored in the physical unit 610(E). The memory management circuit 502 may inquire the system data from the physical unit 610(E) to learn whether the data stored in the physical unit 610(E) is the first-type data.

After the physical unit 610(E) is fully written, the memory management circuit 502 selects another physical unit from the spare area 602 for storing data in the first data that is not yet stored (or programmed). For example, the memory management circuit 502 selects a physical unit 610(E+1) from the spare area 602 and associates the physical unit 610(E+1) to the storage area 601. After the physical unit 610(E+1) is selected, only a physical unit 610(B) is left in the spare area 602, as shown in FIG. 7.

After the physical unit 610(E+1) is selected, the memory management circuit 502 updates the total number of the first-type physical unit in the management table from "2" to "1" and determines that the total number of the first-type physical unit (i.e., "1") is less than the first threshold value (e.g., 2). Hence, the memory management circuit 502 starts one data merging process. However, in another exemplary embodiment, the data merging process may also be started before performing the first programming process or may be triggered at any time point during the first programming process, and the disclosure is not limited thereto.

In the data merging process, the memory management circuit 502 performs one selection process. The selection process is used for selecting a source node of the valid data. For example, in the selection process, the memory management circuit 502 selects one physical unit (hereinafter, also known as a second physical unit) from the storage area 601 as the source node. The second physical unit selected as the source node matches one filtering condition of the selection process. For example, in an exemplary embodiment, the filtering condition is: one physical unit stored with the least valid data in the storage area 601. Alternatively, in another exemplary embodiment, a data volume of the valid data stored in the selected second physical unit is less than an average value. Herein, the average value refers to an average of the data volume of the valid data stored in at least a part (or all) of the physical units in the storage area 601. However, the filtering condition may also contain any usable conditions, which are not particularly limited by the disclosure.

In an exemplary embodiment, after the second physical unit is selected, the memory management circuit 502 starts to copy (or move) the valid data stored in the second physical unit. For example, the memory management circuit 502 copies (or moves) the valid data stored in the second physical unit to another physical unit (hereinafter, also known as a third physical unit). Herein, the third physical unit is also selected from the spare area 602 and configured to collectively store the valid data collected in the data merging process. After all the valid data stored in the second physical unit are copied (or moved) to the third physical unit, the second physical unit is erased.

In an exemplary embodiment, after the second physical unit is selected, the memory management circuit 502 further determines whether the data volume of the valid data stored in the second physical is greater than one preset value. For example, the data volume of the valid data stored in one specific physical unit is represented by one valid count of the specific physical unit. Herein, the valid count is corresponding to a total number of physical sub-units stored with the valid data in the specific physical unit. For example, if the valid count of the second physical unit is "2", it indicates that there are 2 physical sub-units stored with the valid data in the second physical unit. In the present exemplary embodiment, one physical sub-unit refers to one physical programming unit. However, in another exemplary embodiment, one physical sub-unit may also be composed of any number of the memory cells in one physical erasing unit.

In an exemplary embodiment, the memory management circuit 502 may determine whether the valid count of the second physical unit is greater than a preset count value. If the valid count of the second physical unit is greater than the preset count value, the memory management circuit 502 determines that the data volume of the valid data stored in the second physical unit is greater than the preset value and then starts to copy (or move) the valid data stored in the second physical unit; however, if the valid count of the second physical unit is not greater than the preset count value, the memory management circuit 502 determines that the data volume of the valid data stored in the second physical unit is not greater than the preset value. If the data volume of the valid data stored in the second physical unit is not greater than the preset value, the memory management circuit 502 erases the second physical unit and directly stops the data merging process.

Specifically, after the second physical unit is erased (i.e., one spare physical unit is released), the memory management circuit 502 may require a processing time for updating the management table (e.g., adding "1" to the total umber of the first-type physical unit). However, in an exemplary embodiment, in the case that the data volume of the valid data stored in the second physical unit is not greater than the preset value, the memory management circuit 502 may still directly stop the data merging process during the processing time period even if the total number of the first-type physical unit is not updated completely yet. In addition, if the data merging process is stopped based on the determination of the data volume of the valid data not being greater than aforesaid preset value, it is possible that the updated total number of the first-type physical unit may reach or not reach aforesaid second threshold value after aforesaid processing time is expired, and the disclosure is not limited thereto.

In the present exemplary embodiment, the preset count value and the preset value are both zero. In other words, if the second physical unit selected as the source node of the valid data does not store any valid data which needs to be copied (or moved) in the data merging process, the second physical unit may be erased immediately and released as one spare physical unit. Meanwhile, the executing data merging process is stopped immediately. Then, the data in the first data that is not yet stored (or programmed) (e.g., the data belonging to the logical units 612(32) to 612(D)) may be immediately programmed into the physical unit 610(E+1) or more physical units.

It is worth mentioning that, in the exemplary embodiment of FIG. 7, the first programming process is configured to program the sequential data belonging to the logical units 612(0) to 612(D), and thus one spare physical unit may be released correspondingly each time when one physical unit in the storage area 601 is fully written. As such, it can still be ensured that the first programming process may be performed smoothly even if the total number of the first-type physical unit does not reach one preset number (e.g., aforesaid second threshold value) at all during the first programming process. In addition, aforementioned operation of rapidly starting and then stopping the data merging process may also be applied in the subsequent process of storing the data belonging to the logical units 612(32) to 612(D), which is not repeated hereinafter.

In an exemplary embodiment, if the first data is the first-type data, the writing bandwidth of the first programming process is restricted to be no larger than a preset bandwidth after the data merging process is started. Herein, the writing bandwidth refers to an amount of data programmed into the rewritable non-volatile memory module 406 per second. In other words, by restricting the writing bandwidth of the first programming process to be no larger than the preset bandwidth, more writing bandwidth may be provided for the data merging process to improve a collection efficiency for the valid data in the data merging process and thereby reducing the execution time of the data merging process.

In an exemplary embodiment, if the first data is the first-type data, the first programming process is suspended after (or when) the data merging process is started. Herein, suspending the first programming process may be considered as restricting the writing bandwidth of the first programming process to be zero. For example, in an exemplary embodiment, the memory management circuit 502 may manage a command queue which is configured to temporarily store at least one command instructing for storing data. For example, the command queue sequentially outputs commands temporarily stored therein based on a First In First Out rule. If the command queue outputs one command instructing for storing the first data, the memory management circuit 502 instructs the rewritable non-volatile memory module 406 to store at least one part of the first data. In addition, if the command queue outputs one command instructing for storing data collected by the data merging process, the memory management circuit 502 instructs the rewritable non-volatile memory module 406 to store the data collected in the data merging process.

In an exemplary embodiment, if the first data is the first-type data, the memory management circuit 502 temporarily stops adding the command instructing for storing the first data into the command queue. Meanwhile, more commands instructing for storing the data collected by the data merging process may be added into the command queue so the operation of storing the data collected by the data merging process back to the rewritable non-volatile memory module 406 may be continuously performed. Accordingly, it can be ensured that a transmission bandwidth may be completely provided for the data merging process while the first programming process is suspended, so that the execution time of the data merging process may be further reduced. After the data merging process is stopped, the first programming process may be resumed. For example, after the data merging process is stopped, the memory management circuit 502 resumes adding the command instructing for storing the first data into the command queue.

In an exemplary embodiment, if the first data is the second-type data, the memory management circuit 502 permits the data merging process and the first programming process to share the transmission bandwidth after the data merging process is started. For example, in an exemplary embodiment where said command queue is configured, if the first data is the second-type data, the command instructing for storing the first data and the command instructing for storing the data collected by the data merging process may both be added into the command queue. For example, the memory management circuit 502 may add the command instructing the storing of the first data and the command instructing for storing the data collected by the data merging process in the command queue randomly or according to a preset proportion. Then, a corresponding write operation may be performed by the rewritable non-volatile memory module 406 according to the output of the command queue. Therefore, as compared to the situation where the first data is the first-type data, if the data merging process is triggered and the first data is the second-type data, the writing bandwidth of the first programming process occupies a larger proportion of the entire writing bandwidth of the rewritable non-volatile memory module 406.

In an exemplary embodiment, the first programming process is performed following a previous programming process (hereinafter, also known as a second programming process). The second programming process is configured to store another data (hereinafter, also known as second data) from the host system 11. Herein, the second data is the second-type data. In other words, the second data belongs to a plurality of discrete logical units. In an exemplary embodiment, the operation of stopping the executing data merging process before the total number of the first-type physical unit reaches the second threshold value is performed (only) after determining that the first data is the first-type data (or the first programming process is the sequential write process) and the first programming process follows the second programming process.

Figure 8:
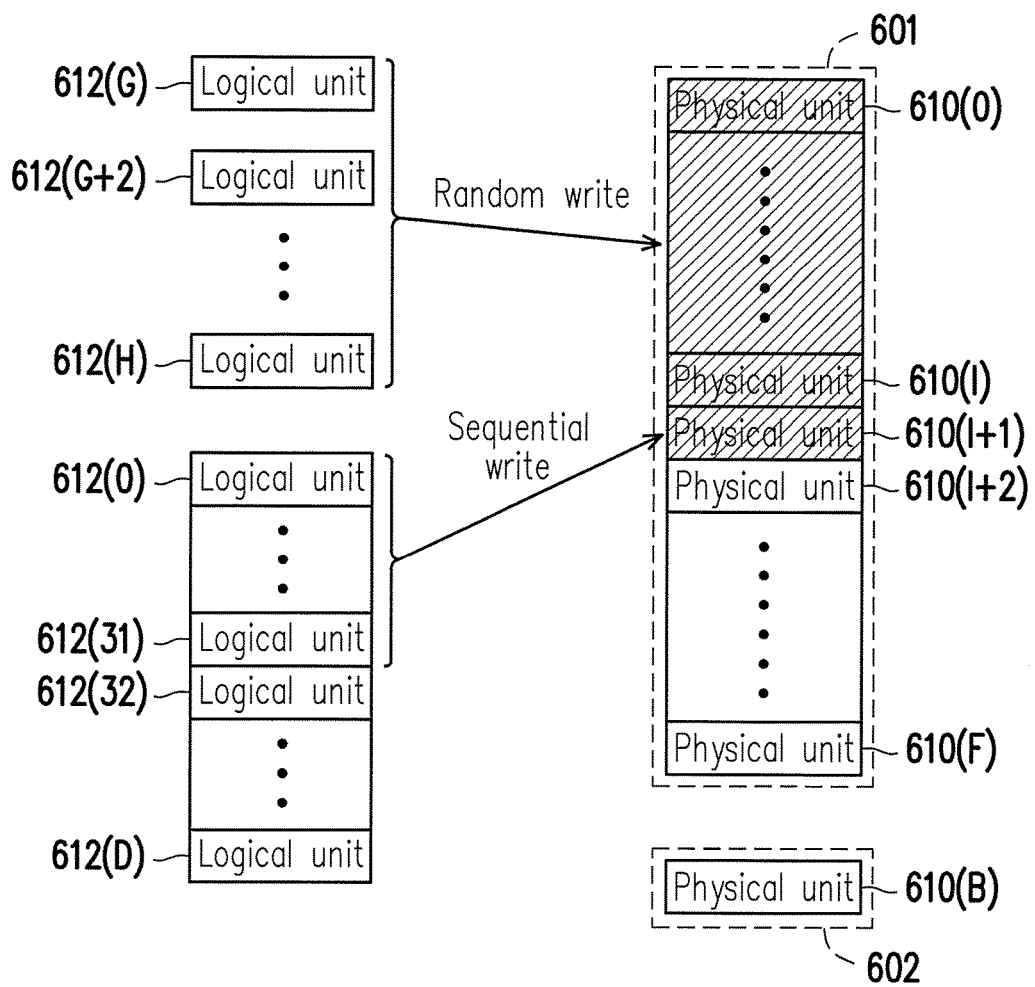
FIG. 8 is a schematic diagram of the programming process according to another exemplary embodiment of the disclosure.

FIG. 8 is a schematic diagram of the programming process according to another exemplary embodiment of the disclosure.

Referring to FIG. 8, the host system 11 instructs to store data (i.e., the second data) belonging to the logical units 612(G), 612(G+2), . . . , 612(H) first and then store the data (i.e., the first data) belonging to the logical units 612(0) to 612(D). Herein, the logical units 612(G), 612(G+2), . . . , 612(H) are discrete (i.e., non-consecutively numbered) and the logical units 612(0) to 612(D) are consecutive (i.e., consecutively numbered). Therefore, the second data is the second-type data and the first data is the first-type data.

In the present exemplary embodiment, the memory management circuit 502 first performs one programming process (i.e., the second programming process) to program the second data into the physical units 610(0) to 610(I). Then, the memory management circuit 502 performs the first programming process to program the first data into the rest of the physical units including a physical unit 610(I+1). Herein, the second programming process for programming the second data is also known as the random write process, and the first programming process for programming the first data is also known the sequential write process.

In the present exemplary embodiment, if one data merging process is performed during the second programming process, the memory management circuit 502 (only) stops the data merging process according to a preset rule (e.g., the data merging process is stopped when determining that the total umber of the first-type physical unit reaches aforesaid second threshold value) without performing said operation of stopping the data merging process before the total number of the first-type physical unit reaches aforesaid second threshold value. However, after the first programming process is performed, if one data merging process is performed, the memory management circuit 502 may directly stop the data merging process before the total number of the first-type physical unit reaches the second threshold value, so as to prevent the execution speed of the first programming process from being influenced by the data merging process. Further, details regarding other operations in the exemplary embodiment of FIG. 8 are already described in the exemplary embodiment of FIG. 7, which are not repeated hereinafter.

It is worth mentioning that, in another exemplary embodiment of FIG. 8, before the second programming process is performed, another sequential write process (hereinafter, also known as a third programming process) for programming the first-type data is already performed. Therefore, in the first programming process performed following the second programming process, if the data merging process is performed, it indicates that the physical units 610(0) to 610(F) belonging to the storage area 601 at the time are actually stored with both the first-type data (i.e., the sequential data) and the second-type data (i.e., the non-sequential data) at the same time. For example, the storage area 601 is fully written by the sequential data and the non-sequential data.

Figure 9:
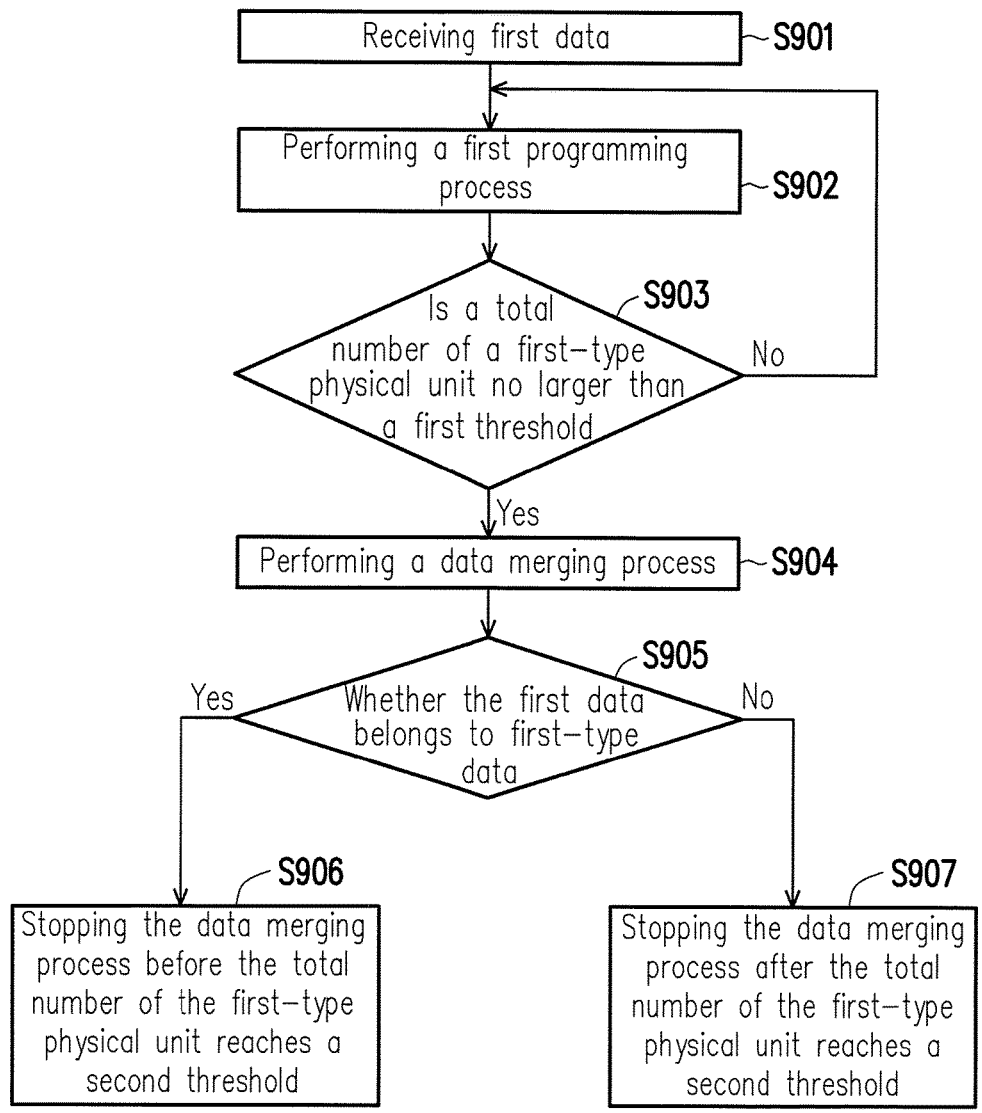
FIG. 9 is a flowchart illustrating a memory management method according to an exemplary embodiment of the disclosure.

FIG. 9 is a flowchart illustrating a memory management method according to an exemplary embodiment of the disclosure.

Referring to FIG. 9, in step S901, first data is received. In step S902, a first programming process is performed. In step S903, whether a total number of a first-type physical unit is no larger than a first threshold value is determined. If not, the method returns back to step S902. If the total number of the first-type physical unit is no larger than the first threshold value, a data merging process is performed in step S904. In step S905, whether the first data is first-type data is determined. If the first data is the first-type data, the data merging process is stopped before the total number of the first-type physical unit reaches a second threshold value in step S906. If the first data is not the first-type data (i.e., the first data is second-type data), the data merging process is stopped after the total number of the first-type physical unit reaches the second threshold value in step S907.

Figure 10:
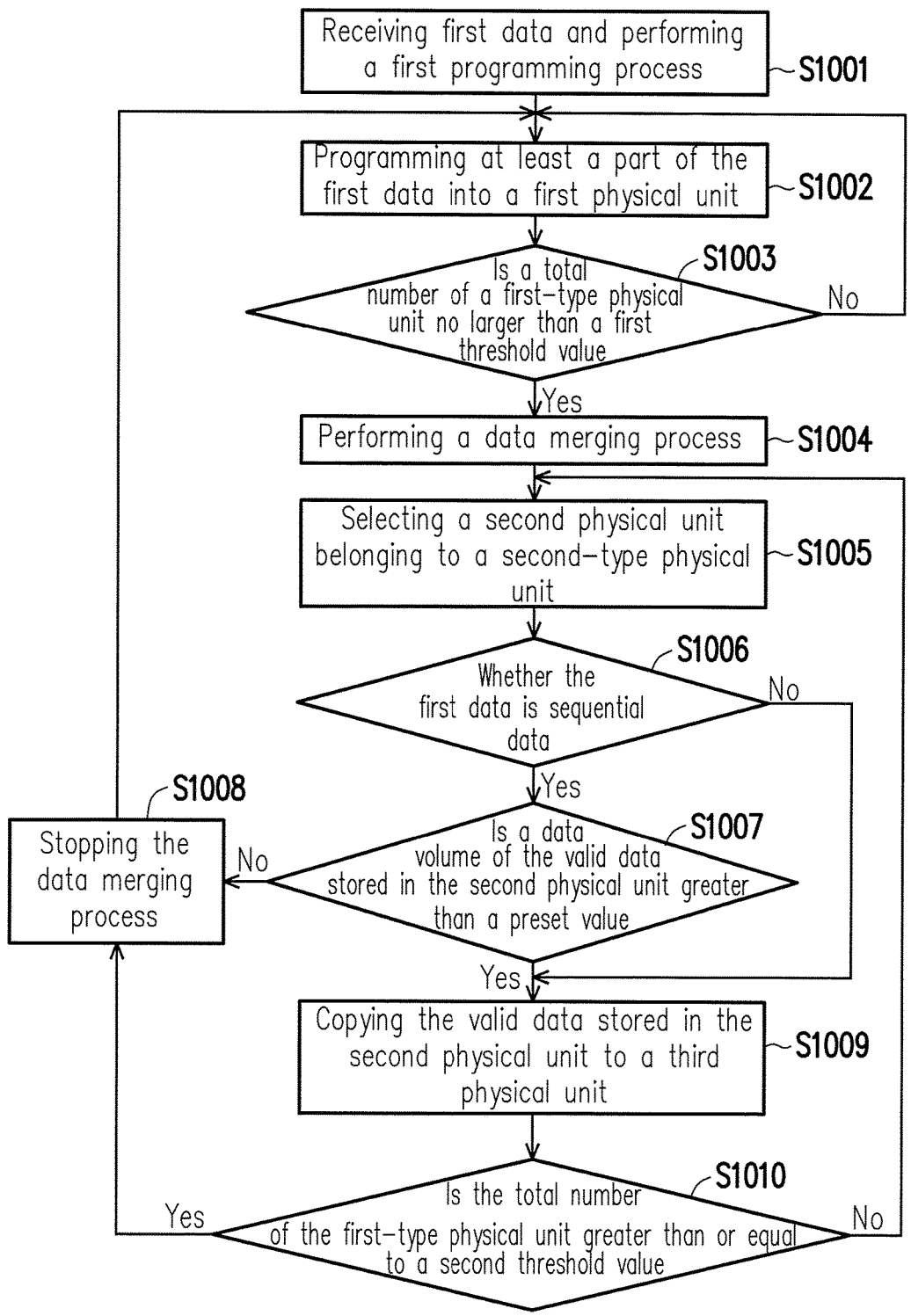
FIG. 10 is a flowchart illustrating a memory management method according to another exemplary embodiment of the disclosure.

FIG. 10 is a flowchart illustrating a memory management method according to another exemplary embodiment of the disclosure.

Referring to FIG. 10, in step S1001, first data is received and a first programming process is performed. In step S1002, at least one part of the first data is programmed into a first physical unit. In step S1003, whether a total number of a first-type physical unit is no larger than a first threshold value is determined. If not, step S1002 is performed again to continuously program the first data into the first physical unit. If the total number of the first-type physical unit is no larger than the first threshold value, a data merging process is performed in step S1004. In step S1005, one second physical unit belonging to a second-type physical unit is selected as a source node of valid data. In step S1006, whether the first data is sequential data is determined. If the first data is the sequential data, whether a data volume of the valid data stored in the second physical unit is greater than a preset value is determined in step S1007. If the data volume of the valid data stored in the second physical unit is not greater than the preset value, the second physical unit is erased and the data merging process is stopped (or ended) in step S1008. If the data volume of the valid data stored in the second physical unit is greater than the preset value, the valid data stored in the second physical unit is copied to a third physical unit and the second physical unit is erased in step S1009. Further, if it is determined that the first data is not the sequential data in step S1006, step S1009 is entered. In step S1010, whether the total number of the first-type physical unit is greater than a second threshold value is determined. If yes, step S1008 is performed to stop (or end) the data merging process. If it is determined that the total number of the first-type physical unit is still less than the second threshold value in step S1010, step S1005 is performed again to select another second physical unit belonging to the second-type physical unit as the source node of the valid data. Step S1002 may be performed following step S1008.

Nevertheless, each of steps depicted in FIG. 9 and FIG. 10 have been described in detail as above, thus related description thereof is not repeated hereinafter. It should be noted that, the steps depicted in FIG. 9 and FIG. 10 may be implemented as a plurality of program codes or circuits, which are not particularly limited in the disclosure. Moreover, the methods disclosed in FIG. 9 and FIG. 10 may be implemented with reference to above embodiments, or may be implemented separately, which are not particularly limited in the disclosure.

In summary, during operation of the memory storage device, one data merging process may be triggered with reduction of the first-type physical unit. After the data merging process is started, if it is determined that the data to be programmed is the sequential data, the data merging process may be stopped before the total number of the first-type physical unit reaches one preset number, such that the influence caused by the data merging process on the writing speed for the sequential data (or the sequential write process) can be reduced.

The previously described exemplary embodiments of the present disclosure have the advantages aforementioned, wherein the advantages aforementioned not required in all versions of the disclosure.

It will be apparent to those skilled in the art that various modifications and variations can be made to the structure of the present disclosure without departing from the scope or spirit of the disclosure. In view of the foregoing, it is intended that the present disclosure cover modifications and variations of this disclosure provided they fall within the scope of the following claims and their equivalents.

What is claimed is:

1. A memory management method for a rewritable non-volatile memory module comprising a plurality of physical units, and the memory management method comprising:
receiving first data and performing a first programming process;
programming at least one part of the first data into a first physical unit of the physical units in the first programming process;
determining whether a total number of a first-type physical unit among the physical units is no larger than a first threshold value, wherein each physical unit belonging to the first-type physical unit does not store valid data;
performing a data merging process if the total number of the first-type physical unit is no larger than the first threshold, such that the total number of the first-type physical unit is changed from a first number to a second number, wherein the second number is greater than the first number;
determining whether the first data is first-type data or second-type data, wherein the first-type data belongs to a plurality of consecutively numbered logical units and the second-type data does not belong to the consecutively numbered logical units;
stopping the data merging process without considering the total number of the first-type physical unit before the second number reaches a second threshold value if in response to that the first data is the first-type data and a data volume of valid data currently stored in a second physical unit selected as a source node for performing the data merge process is not greater than a preset value, wherein the second threshold value is greater than the first threshold value; and
stopping the data merging process after the second number reaches a second threshold value if the first data is the second-type data, wherein the second threshold value is greater than the first threshold value.

2. The memory management method of claim 1, wherein the step of determining whether the first data is the first-type data or the second-type data comprises:
determining whether the first data is the first-type data or the second-type data according to the at least one part of the first data programmed into the first physical unit.

3. The memory management method of claim 1, further comprising:
copying the valid data currently stored in the second physical unit to a third physical unit of the physical units if the first data is the first-type data and the data volume of the valid data currently stored in the second physical unit is greater than the preset value; and
erasing the second physical unit.

4. The memory management method of claim 3, wherein the preset value is zero.

5. The memory management method of claim 3, further comprising:
performing a selection process for selecting the second physical unit and determining whether the data volume of the valid data currently stored in the second physical unit is greater than the preset value, wherein the data volume of the valid data currently stored in the second physical unit is less than an average value.

6. The memory management method of claim 1, further comprising:
suspending the first programming process after the data merging process is started and resuming the first programming process after the data merging process is stopped if the first data is the first-type data; and
permitting the data merging process and the first programming process to share a transmission bandwidth if the first data is the second-type data.

7. The memory management method of claim 6, further comprising:
managing a command queue configured to temporarily store at least one command instructing for storing data;
stopping the addition of a command instructing for storing of the first data into the command queue if the first data is the first-type data; and
adding a command instructing for storing of data collected by the data merging process and the command instructing the storing of the first data into the command queue if the first data is the second-type data.

8. The memory management method of claim 1, further comprising:
determining whether the first programming process follows a second programming process, wherein the second programming process is configured to program second data into the physical units, wherein the second data is the second-type data,
wherein the step of stopping the data merging process before the second number reaches the second threshold value is performed after determining that the first data is the first-type data and the first programming process follows the second programming process.

9. A memory storage device, comprising:
a connection interface unit, configured to couple to a host system;
a rewritable non-volatile memory module, comprising a plurality of physical units; and
a memory control circuit unit, coupled to the connection interface unit and the rewritable non-volatile memory module,
wherein the memory control circuit unit is configured to receive first data and perform a first programming process,
wherein the memory control circuit unit is further configured to send a programming command sequence instructing for programming at least one part of the first data into a first physical unit of the physical units in the first programming process,
wherein the memory control circuit unit is further configured to determine whether a total number of a first-type physical unit among the physical units is no larger than a first threshold value, wherein each physical unit belonging to the first-type physical unit does not store valid data,
wherein the memory control circuit unit is further configured to perform a data merging process if the total number of the first-type physical unit is no larger than the first threshold value, such that the total number of the first-type physical unit is changed from a first number to a second number, wherein the second number is greater than the first number,
wherein the memory control circuit unit is further configured to determine whether the first data is first-type data or second-type data, wherein the first-type data belongs to a plurality of consecutively numbered logical units and the second-type data does not belong to the consecutively numbered logical units,
wherein the memory control circuit unit is further configured to stop the data merging process without considering the total number of the first-type physical unit before the second number reaches a second threshold value if in response to that the first data is the first-type data and a data volume of valid data currently stored in a second physical unit selected as a source node for performing the data merge process is not greater than a preset value, wherein the second threshold value is greater than the first threshold value, wherein the memory control circuit unit is further configured to stop the data merging process after the second number reaches a second threshold value if the first data is the second-type data, wherein the second threshold value is greater than the first threshold value.

10. The memory storage device of claim 9, wherein the operation of determining whether the first data is the first-type data or the second-type data by the memory control circuit unit comprises:

determining whether the first data is the first-type data or the second-type data according to the at least one part of the first data programmed into the first physical unit.

11. The memory storage device of claim 9, wherein the memory control circuit unit is further configured to copy the valid data currently stored in the second physical unit to a third physical unit of the physical units if the first data is the first-type data and the data volume of the valid data currently stored in the second physical unit is greater than the preset value, wherein the memory control circuit unit is further configured to erase the second physical unit.

12. The memory storage device of claim 11, wherein the preset value is zero.

13. The memory storage device of claim 11, wherein the memory control circuit unit is further configured to perform a selection process for selecting the second physical unit and determine whether the data volume of the valid data currently stored in the second physical unit is greater than the preset value, wherein the data volume of the valid data currently stored in the second physical unit is less than an average value.

14. The memory storage device of claim 9, wherein the memory control circuit unit is further configured to suspend the first programming process after the data merging process is started and resume the first programming process after the data merging process is stopped if the first data is the first-type data, wherein the memory control circuit unit is further configured to permit the data merging process and the first programming process to share a transmission bandwidth if the first data is the second-type data.

15. The memory storage device of claim 14, wherein the memory control circuit unit is further configured to manage a command queue configured to temporarily store at least one command instructing for storing data, wherein the memory control circuit unit is further configured to stop adding a command instructing for storing of the first data into the command queue if the first data is the first-type data, wherein the memory control circuit unit is further configured to add a command instructing for storing of data collected by the data merging process and the command instructing the storing of the first data into the command queue if the first data is the second-type data.

16. The memory storage device of claim 9, wherein the memory control circuit unit is further configured to determine whether the first programming process follows a second programming process, wherein the second programming process is configured to program second data into the physical units, wherein the second data is the second-type data, wherein the memory control circuit unit performs the operation of stopping the data merging process before the second number reaches the second threshold value after determining that the first data is the first-type data and the first programming process follows the second programming process.

17. A memory control circuit unit for controlling a rewritable non-volatile memory module comprising a plurality of physical units, and the memory control circuit unit comprising:

a host interface, configured to couple to a host system;

a memory interface, configured to couple to the rewritable non-volatile memory module; and a memory management circuit, coupled to the host interface and the memory interface, wherein the memory management circuit is configured to receive first data and perform a first programming process, wherein the memory management circuit is further configured to send a programming command sequence instructing for programming at least one part of the first data into a first physical unit of the physical units in the first programming process, wherein the memory management circuit is further configured to determine whether a total number of a first-type physical unit among the physical units is no larger than a first threshold value, wherein each physical unit belonging to the first-type physical unit does not store valid data, wherein the memory management circuit is further configured to perform a data merging process if the total number of the first-type physical unit is no larger than the first threshold value, such that the total number of the first-type physical unit is changed from a first number to a second number, wherein the second number is greater than the first number, wherein the memory management circuit is further configured to determine whether the first data is first-type data or second-type data, wherein the first-type data belongs to a plurality of consecutively numbered logical units and the second-type data does not belong to the consecutively numbered logical units, wherein the memory management circuit is further configured to stop the data merging process without considering the total number of the first-type physical unit before the second number reaches a second threshold value if in response to that the first data is the first-type data and a data volume of valid data currently stored in he a second physical unit selected as a source node for performing the data merge process is not greater than a preset value, wherein the second threshold value is greater than the first threshold value, wherein the memory management circuit is further configured to stop the data merging process after the second number reaches a second threshold value if the first data is the second-type data, wherein the second threshold value is greater than the first threshold value.

18. The memory control circuit unit of claim 17, wherein the operation of determining whether the first data is the first-type data or the second-type data by the memory management circuit comprises:

determining whether the first data is the first-type data or the second-type data according to the at least one part of the first data programmed into the first physical unit.

19. The memory control circuit unit of claim 17,
wherein the memory management circuit is further configured to copy the valid data stored in the second physical unit to a third physical unit of the physical units if the first data is the first-type data and the data volume of the valid data currently stored in the second physical unit is greater than the preset value,
wherein the memory management circuit is further configured to erase the second physical unit.

20. The memory control circuit unit of claim 19, wherein the preset value is zero.

21. The memory control circuit unit of claim 19,
wherein the memory management circuit is further configured to perform a selection process for selecting the second physical unit and determine whether the data volume of the valid data currently stored in the second physical unit is greater than the preset value,
wherein the data volume of the valid data currently stored in the second physical unit is less than an average value.

22. The memory control circuit unit of claim 17, wherein the memory management circuit suspends the first programming process after the data merging process is started and resume the first programming process after the data merging process is stopped if the first data is the first-type data,
wherein the memory management circuit is further configured to permit the data merging process and the first programming process to share a transmission bandwidth if the first data is the second-type data.

23. The memory control circuit unit of claim 22,
wherein the memory management circuit is further configured to manage a command queue configured to temporarily store at least one command instructing for storing data,
wherein the memory management circuit is further configured to stop adding a command instructing for storing of the first data into the command queue if the first data is the first-type data,
wherein the memory management circuit is further configured to add a command instructing for storing of data collected by the data merging process and the command instructing the storing of the first data into the command queue if the first data is the second-type data.

24. The memory control circuit unit of claim 17, wherein the memory management circuit is further configured to determine whether the first programming process follows a second programming process, wherein the second programming process is configured to program second data into the physical units, wherein the second data is the second-type data,
wherein the memory management circuit performs the operation of stopping the data merging process before the second number reaches the second threshold value after determining that the first data is the first-type data and the first programming process follows the second programming process.

* * * * *